United States Patent
Sandbote et al.

(10) Patent No.: US 7,380,153 B2
(45) Date of Patent: May 27, 2008

(54) MICROPIPELINE STAGE CONTROLLER AND CONTROL SCHEME

(75) Inventors: Sam Brandon Sandbote, Austin, TX (US); Denzil Savio Fernandes, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 317 days.

(21) Appl. No.: 11/040,566

(22) Filed: Jan. 21, 2005

(65) Prior Publication Data

US 2005/0156632 A1    Jul. 21, 2005

Related U.S. Application Data

(60) Provisional application No. 60/537,874, filed on Jan. 20, 2004.

(51) Int. Cl.
*G06F 1/04* (2006.01)
(52) U.S. Cl. .................... 713/502; 713/500; 713/501
(58) Field of Classification Search ................ 713/500, 713/501, 502
See application file for complete search history.

(56) References Cited

U.S. PATENT DOCUMENTS 6,943,595 B2 * 9/2005 Sugimoto et al. .......... 327/141
2005/0165995 A1 * 7/2005 Gemelli et al. ............ 710/305

* cited by examiner

*Primary Examiner*—Thomas Lee
*Assistant Examiner*—Malcolm D Cribbs
(74) *Attorney, Agent, or Firm*—Ronald O. Neerings; Wade J. Brady, III; Frederick J. Telecky, Jr.

(57) ABSTRACT

A technique for controlling local events in two-phase asynchronous handshake circuits.

38 Claims, 3 Drawing Sheets

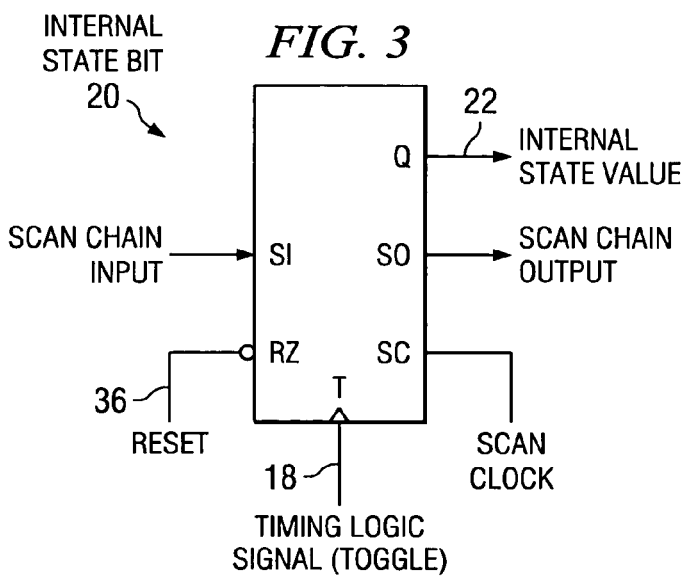
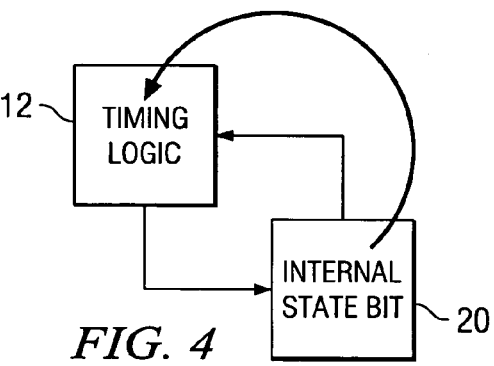
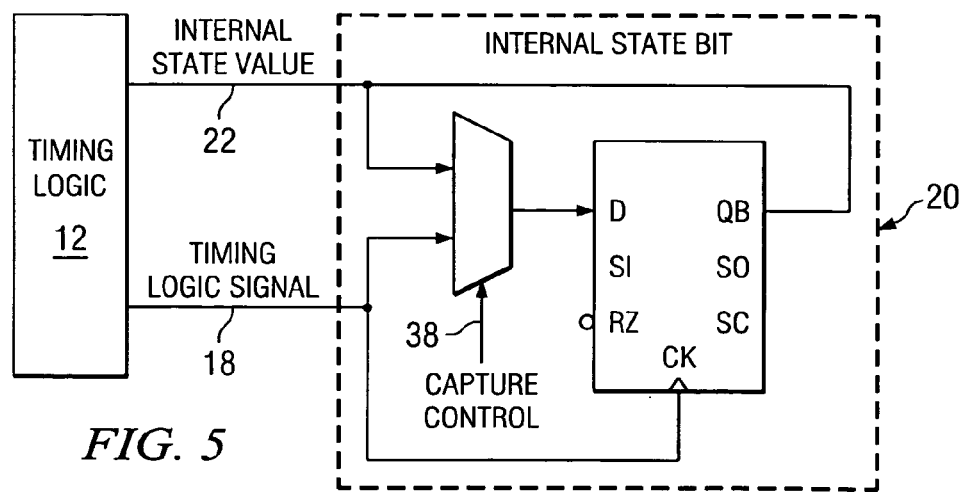

MICROPIPELINE STAGE CONTROLLER AND CONTROL SCHEME

This application is claims priority to application 60/537,874 filed Jan. 20, 2004.

FIELD OF THE INVENTION

The invention relates to digital logic. In particular, the invention relates to the logic used to control local events in asynchronous handshake digital logic circuits.

BACKGROUND OF THE INVENTION

In the design of digital logic, it is a fundamental task to be able to sequence behavior in time where required. For example, an operation X must not be activated without its proper data operands A and B ready and available, and any other operations Y and Z which use the result of X must both be finished and ready to accept a new result from X. The former requirement is known as a dependency, and the latter known as an antidependency.

Synchronous logic solves the problem of sequencing behavior in digital designs by activating all operations on the occurrence of a single, global event. This global event is the rising or falling edge of a periodic clock signal.

Contrarily, asynchronous logic solves the problem of sequencing behavior by activating operations based on the occurrence of many distributed, largely unrelated, and highly localized events. These events are the rising or falling edges of potentially any logic gate within the design.

Unlike the synchronous design style with a global clock signal, asynchronous logic design is extremely variegated. A wide variety of styles exist as known art. Each of these styles of asynchronous logic may be classified according to several distinguishing features as here described.

Firstly, each of these styles is distinguished by the size of the operation activated by a local event. In some styles, a local event activates the processing of an entire datapath of logic. For example, the multiplication of two 32-bit operands to form a 64-bit result might be controlled by a single local event. Such would be said to be very coarse-grained asynchronous event control. In other styles of asynchronous logic, local events are identifiable as a signal to activate the logical NAND of two bits in only a single gate. Such would be said to be very fine-grained event control.

Styles of asynchronous logic which share the same granularity of event control are further distinguished by a multitude of logical communication protocols used to generate the local events based on the occurrence of other events in the asynchronous logic. In some cases simply the change in state of a signal, any edge or level change, may generate an event. This is known in the language of asynchronous logic as a two-phase signaling protocol. In other cases, both a rise and fall of a signal in series are required to generate a local event. This is known as a four-phase signaling protocol.

The safe design of any logic, whether synchronous or asynchronous, depends on assumptions made about timing. All logic in synchronous designs, for example, must take less time than the period of the global clock for proper safety. Asynchronous logic is no different in that timing assumptions put constraints on design.

Because a local event present in asynchronous logic represents a designer's intentional sequencing of overall behavior, it inevitably requires information from its dependencies and antidependencies in order to activate. Thus, each local event is generated based on a collection of occurrences of other events. All events related to dependencies for the operation must be collected to ensure the operation is guaranteed to have the correct data values available. This is known in the jargon of computer science as a join. More, all events related to antidependencies must be collected to ensure that the operation may activate safely without adversely affecting another. This is known in the jargon of computer science as a fork.

A fork or join may also have arbitration involved with event control. Operation X, which uses operands A and B, might hypothetically take A from more than one source. Operation X would be activated when A, and either B1 or B2, were available. Similarly, once X is activated and its result is ready, this result might be delivered to Y and either Z1 or Z2, but not both. Selection of the source of B, and the selection of Z, may be either explicitly directed by another signal, or left to chance as a "first-come-first served" policy. Arbitration is involved in event control wherever an EITHER-OR of events is required before the activation of an operation. It is not necessary wherever a simple AND of events is required to activate an operation.

Before an operation is activated, its joins must complete and its forks must be free to accept the operation's output. This requirement is universally true in asynchronous logic design of any style, for any safe and correctly behaving design. However, asynchronous logic styles distinguish how this timing guarantee is made and at what cost. There is a direct relationship between making a universal guarantee and the resulting circuit size or cost. There is also a direct relationship associated with satisfying the constraints that result from a partial timing correctness guarantee and the implementation complexity of such logic. Implementation complexity negatively impacts a CAD tool or human designer of the physical circuit.

Delay insensitive asynchronous logic ensures that under all circuit conditions, the guarantee of timing correctness is inherently met, no matter the implementation. Building completely delay-insensitive asynchronous logic inevitably involves more safety which must be satisfied by more gates. In some cases this absolute guarantee deteriorates performance because of the more robust event signaling protocol which must be used. Both leakage and switching power in a CMOS transistor implementation are necessarily higher. Nevertheless, delay insensitive asynchronous logic is extremely robust and expedient for numerous applications, and therefore a common style.

Other styles of asynchronous logic make the guarantee of timing correctness while ignoring the delay of wires. During physical implementation of the design, each wire attached to a gate contains a hard and fast time delay constraint, beyond which the entire logic design no longer operates safely. For a design of modern proportions, containing hundreds of thousands or millions of such wires, this assumption is usually unmanageable.

The bundled-delay constraint is the most common trade-off between circuit cost and implementation complexity. A group of logic paths, such as those within a multiplier producing a product from two operands, are grouped. The worst-case delay of this bundled datapath is given a timing constraint, and with this timing constraint the guarantee of timing correctness of the overall asynchronous logic design is made. Clearly, reducing the number of timing constraints by orders of magnitude ameliorates a great burden on implementation complexity. At the same time, avoiding the absolute guarantee of timing correctness that delay insensitive logic makes allows for far less bulky and expensive circuitry.

In all physically implemented asynchronous logic circuits, 100% of the timing constraints derived from the correctness assumptions are met in order to guarantee correct behavior. However, variations in the timing of individual logic paths do exist between different physical circuit embodiments of the same asynchronous logic design, each of which meet all of these timing constraints, operate safely and correctly. These logic path variations appear as symptoms of many perturbations including minute variances in manufacturing, differences in the voltage or temperature at which the circuits operate, and most importantly, different circuit implementations.

When event control involves arbitration due to an EITHER-OR condition, the logic will have correct but non-deterministic behavior because of these timing variations. Operation X involves a join which waits for either B1 or B2 to arrive, and activates based on whichever event arrives first. The race condition between B1 and B2 will see-saw back and forth because of timing variations, and therefore the order of processing in the asynchronous design may change. This nondeterminism is not a fatal flaw, as the overall behavior is correct. However, nondeterminism makes testing of asynchronous logic designs extremely difficult, as the same input applied repetitively to the same physical circuit yields results in different order each time.

For describing any logic design textually, a hardware description language or HDL is used. Since the advent of logic synthesis in the late 1980s, the HDL has become not only a description of the design for purposes of simulation or documentation, but also the way designs are entered and captured. For synchronous design, the HDLs Verilog and VHDL are standardized design entry languages well known in the world community of engineers. HDLs for asynchronous design entry have struggled for standardization and acceptance due to the complexities of describing the asynchronous event control. "Micropipelines" constitute a style of asynchronous logic characterized by coarse-grain event control of a stage of bundled-delay datapath, bounded by locally clocked registers at the start and end. The structure is similar to a synchronous pipeline stage. A set of discrete building blocks for event control, well-known to those skilled in the art, is associated with this style. These building blocks allow for AND, EITHER-OR and signal-controlled OR of events, for both forking and joining. Between the set of locally clocked registers under event control, the datapath has a known worst-case bundled delay. A handshake protocol with request and acknowledge signals is set up between the controllers of all local clocks in the design.

For a single Micropipeline stage, a request signal is sent forward from the start register of the pipe stage in the direction of the datapath to the end register when new operands A and B are both ready to be clocked and enter the combinatorial stage. This request is derived from a join event of A and B. An acknowledge signal is sent backward from the end register opposite of the direction of the datapath to the start, when the output of the stage has been safely latched. When request and acknowledge correspond, registers at the start of the stage are clocked, activating the operation of the datapath with the new A and B operands.

In order to satisfy the bundled-delay timing constraint and guarantee timing correctness of a Micropipeline stage, a delay is intentionally added to the forward request signal, which causes the request to arrive at the end in the same amount of time as the worst-case delay through the datapath within the stage. This matched delay element is among the basic building blocks which characterize Micropipelines.

What is needed is a micropipeline stage controller and control scheme that implements two-phase asynchronous handshakes.

SUMMARY OF THE INVENTION

A micropipeline stage controller and control scheme for controlling timing over asynchronous logic. The present invention provides a glitch-free handshake element with integrated fork/join logic for handshaking with N sources to complete a process join, and M destinations to complete a process fork. Each micropipeline stage uses a controller to handshake with those on which it depends (a process join), and those which depend on it (process fork). The stage controller produces a local clock pulse which clocks the bank of registers comprising its stage. The invention facilitates a significant reduction in the set of micropipeline elements required in known asynchronous micropipeline architectures.

BRIEF DESCRIPTION OF THE DRAWINGS

The features and advantages of the present invention will become apparent from the following detailed description of the present invention in which:

FIG. 3 is a diagram illustrating an example for the state bit shown in FIG. 1 according to one embodiment of the invention.

FIG. 4 is a diagram illustrating the logic propagation timing path which defines the width of the pulse generated by the local clock pulse, according to one embodiment of the invention.

FIG. 5 is a diagram illustrating an example of capture of the value of the timing logic signal by an external capture control signal, according to one embodiment of the invention.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In some instances, well-known electrical structures and circuits are shown in symbolic or block diagram form in order not to obscure the present invention.

Figure 1:
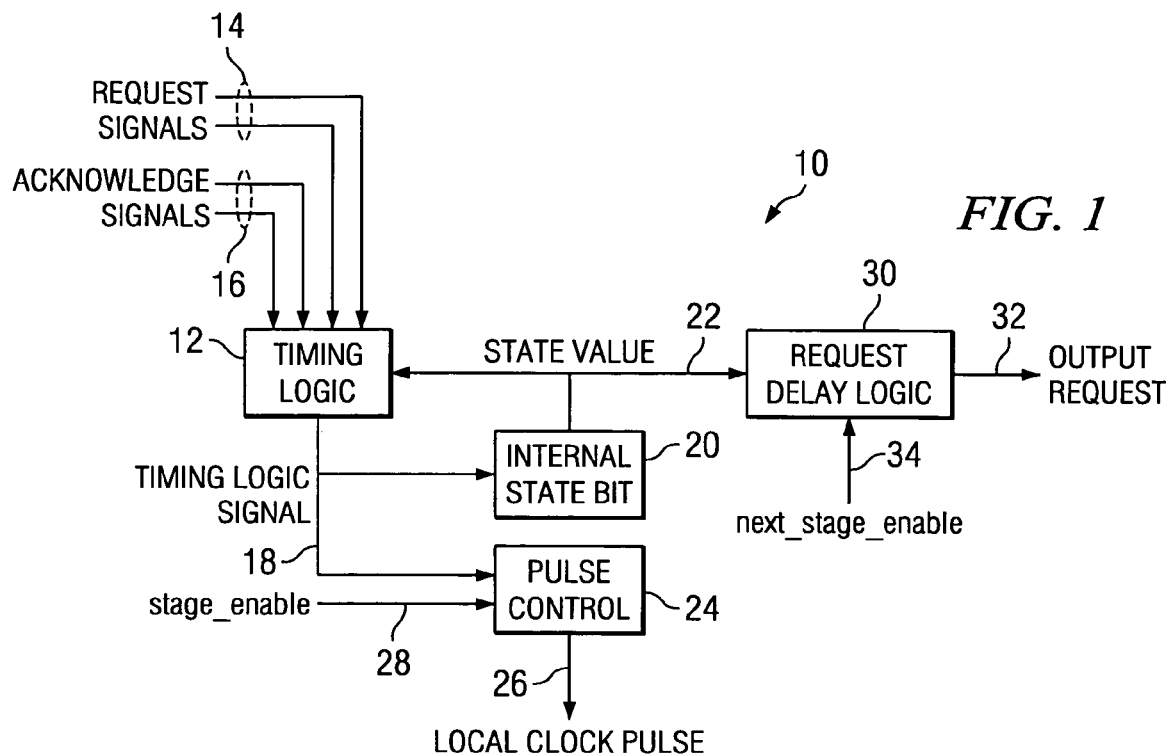
FIG. 1 is a diagram illustrating a system in which one embodiment of the invention can be practiced.

FIG. 1 is a diagram illustrating a system 10 in which one embodiment of the invention can be practiced. It consists of timing logic 12 having a plurality of input request signals 14 and a plurality of input acknowledge signals 16 producing timing logic signal 18, an internal state bit 20 which holds the state value 22, a pulse control 24 which generates local clock pulse 26 using the timing logic signal plus a stage_enable control input 28, and also a request delay unit 30 generating output request 32 using the internal state value plus a next_stage_enable control input 34.

Figure 2:
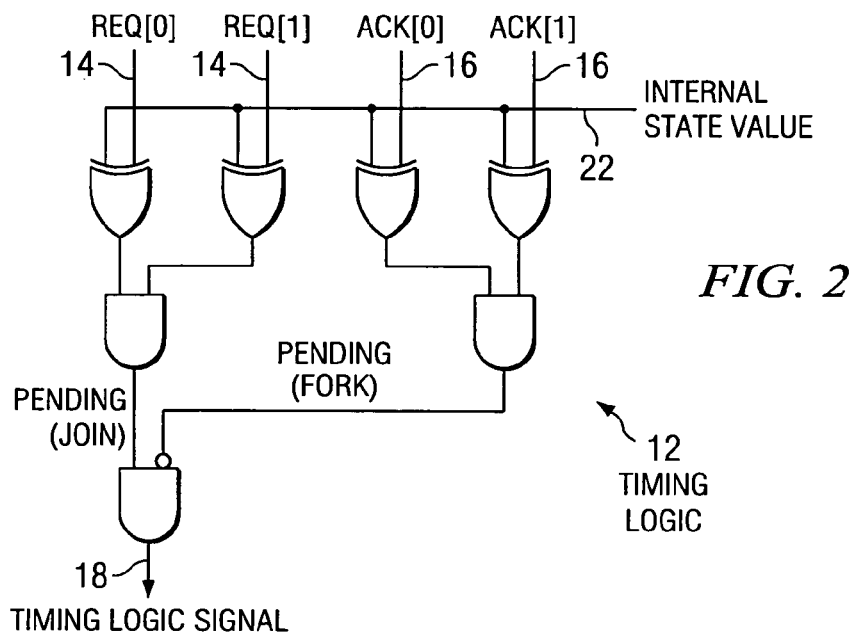
FIG. 2 is a diagram illustrating an example for timing logic shown in FIG. 1 according to one embodiment of the invention.

FIG. 2 is a diagram illustrating an example for timing logic 12 shown in FIG. 1, according to one embodiment of the invention. In the stable state of the system, the timing logic's signal 18 remains de-asserted. In one embodiment of the invention, the timing logic's signal enters the logic 0 state when de-asserted.

The timing logic compares the state of each of the input request signals 14 and each of the input acknowledge signals 16 with the state value 22. The comparisons are made bitwise on each input signal. In this context, a successful comparison is defined as a match between the digital level of the state value 22 and the digital level of the given input request or acknowledge signal. If at a given time the state value is a logic 0, then a successful comparison will only be made with another logic 0 on the given input request or enable signal. If at a given time the state value is a logic 1, then a successful comparison will only be made with another logic 1 on the given input request or enable signal. An unsuccessful comparison results from a mismatch between the digital level of the state value 22 and the digital level of the given input request or acknowledge signal. A comparison of a state value of logic 0 against an input request or enable signal which is logic 1 is unsuccessful. Likewise, a comparison of a state value of logic 1 against an input request or enable signal which is logic 0 is unsuccessful.

The timing logic's output signal is asserted when, simultaneously, each of the input requests 14 make successful comparisons with the state value 22 and each of the input acknowledge signals 16 make unsuccessful comparisons with the state value. In one embodiment of the invention, the timing logic's signal enters the logic 1 state when asserted.

FIG. 3 is a diagram illustrating an example for the state bit 20 shown in FIG. 1 according to one embodiment of the invention. When the timing logic signal 18 is asserted, a change in the polarity of the state value occurs. If at a given time the state value is a logic 0, then the state value becomes a logic 1 upon receiving the timing logic signal. If at a given time the state value is a logic 1, then the state value becomes a logic 0 upon receiving the timing logic signal.

When the timing logic signal 18 causes the state value 22 to change polarity, the system 10 temporarily enters an unstable state. The new state value propagates from the state bit 20 back into the timing logic 12. Each comparison against an input request 14 which had previously been unsuccessful becomes successful. Each comparison against an input acknowledge 16 which had previously been successful becomes unsuccessful. This condition causes the timing logic signal to be de-asserted again. The timing logic signal thus produces either a positive or negative pulse during the brief time that the system 10 is unstable.

The state bit 20 is sensitive to the edge of the timing logic signal when it becomes asserted. The state value 22 changes only once and does not toggle repetitively or oscillate during the brief time in which the timing logic signal 18 remains asserted. Nor does the state value change again upon the de-assertion of the timing logic signal. This behavior may be embodied by an edge-sensitive toggle flip-flop or D flip-flop, or by many other forms known to those skilled in the art.

When the system 10 is first connected to an electrical power supply, the state value is unknown. For this reason the state bit includes a reset input 36. In one embodiment of the invention, the state value may be reset to a logic 0. In another embodiment of the invention, the state bit may be reset to a logic 1. In the context of an asynchronous handshake logic design incorporating the system 10, some state values will necessarily be reset to 0 while others are reset to 1, in order to effectuate correct overall behavior of the design. The knowledge of which to reset to logic 0 and which to reset to logic 1 is beyond the scope of the present invention.

The local clock pulse 26 is formed by the pulse control 24. If the input control signal stage_enable 28 is asserted, the local clock pulse is a version of the pulse on the timing logic signal 18 created during the time the system 10 is unstable. However, if the stage_enable input control is deasserted, all pulses on the timing logic signal are filtered out, and the local clock pulse output remains quiescent during the unstable periods. The output pulse may be of the same logic polarity as the timing control signal, or it may be inverted, as required by the context of the system 10.

FIG. 4 is a diagram illustrating the logic propagation timing path which defines the width of the pulse generated by the local clock pulse 26, according to one embodiment of the invention. The logic propagation time is at least the sum of, among other factors, the delay due to the change in the state value 22 occurring in state bit 20 as a result of the assertion of the timing logic signal 18, the propagation of the new state back to the timing logic 12, and the delay due to the logic propagation through the comparators and other digital gates to de-assert the timing logic signal.

For testing purposes apparent to those skilled in the art, it is necessary to be able to both control and observe the timing logic 12. The inputs to the timing control logic are the state value local to the system 10, plus a plurality of input request signals 14 and a plurality of input acknowledge signals 16. The state value emanating from the state bit is the direct output of a scan able storage element and can therefore be controlled. Although it is beyond the scope of the invention, the sources of the input request signals 14 and input acknowledge signals 16 are also the direct outputs of scan able storage elements when the system 10 is considered in context.

FIG. 5 is a diagram illustrating an example of capture of the value of the timing logic signal 18 by an external capture control signal 38, according to one embodiment of the invention. This capture method ensures that the timing logic signal 18 may be observed for testing.

Figure 6:
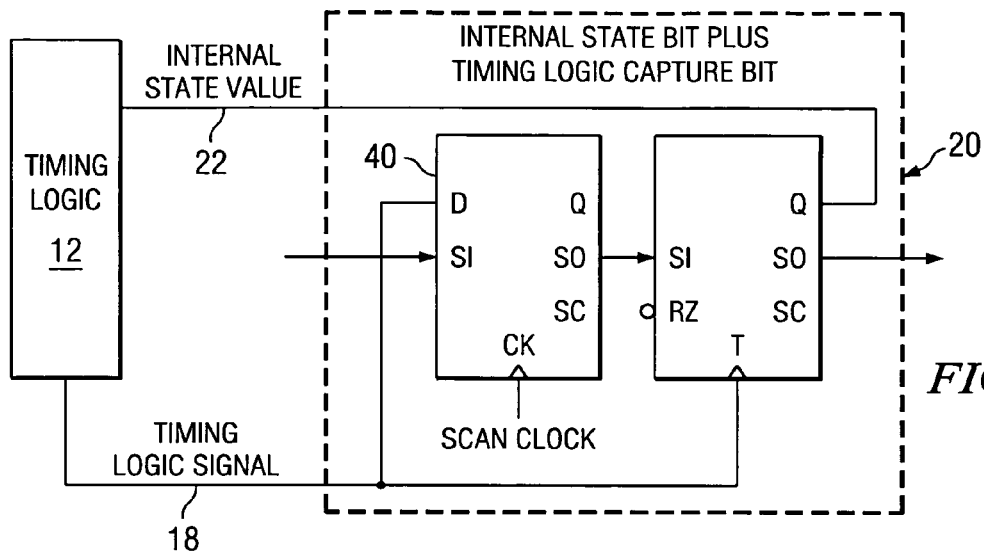
FIG. 6 is a diagram illustrating an example of continuous capture of the value of the timing logic signal using a dedicated storage element, according to one embodiment of the invention.

FIG. 6 is a diagram illustrating an example of continuous capture of the value of the timing logic signal 18 using a dedicated storage element 40, according to one embodiment of the invention. This capture method also ensures that the timing logic signal 18 may be observed for testing.

Figure 7:
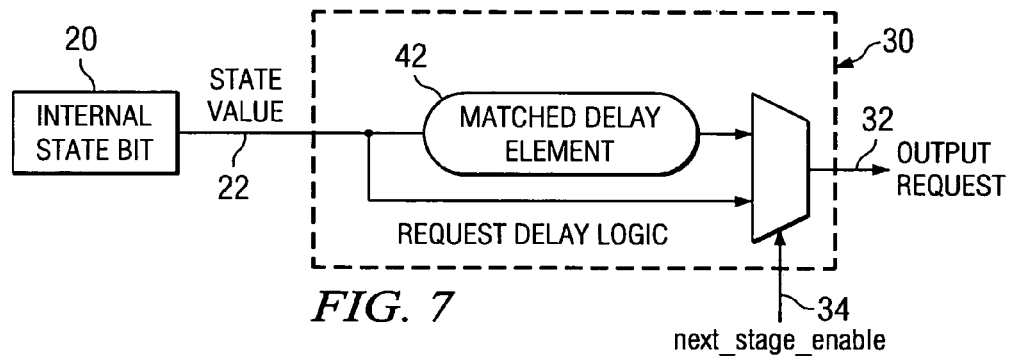
FIG. 7 is a diagram illustrating the request delay logic shown in FIG. 1 and an example of the mechanism by which the matched delay element may be bypassed using a next_stage_enable signal, according to one embodiment of the invention.

FIG. 7 is a diagram illustrating the request delay logic 30 shown in FIG. 1 and an example of the mechanism by which the matched delay element 42 may be bypassed using a next_stage_enable signal 34, according to one embodiment of the invention. As it will be apparent to one skilled in the art, the matched delay element 42 is tuned in the context of the system 10 in order to provide the same propagation time delay as the Micropipeline datapath under local control by the system.

When the next_stage_enable signal 34 is de-asserted, a change in the state value 22 will propagate through the matched delay element 42 and be delayed in time accordingly before exiting the system 10 as the output request signal 32. The assertion of the next_stage_enable signal 34 allows a change in the state value 22 to bypass this imposed delay and exit the system 10 as the output request signal 32 much faster.

Figure 8:
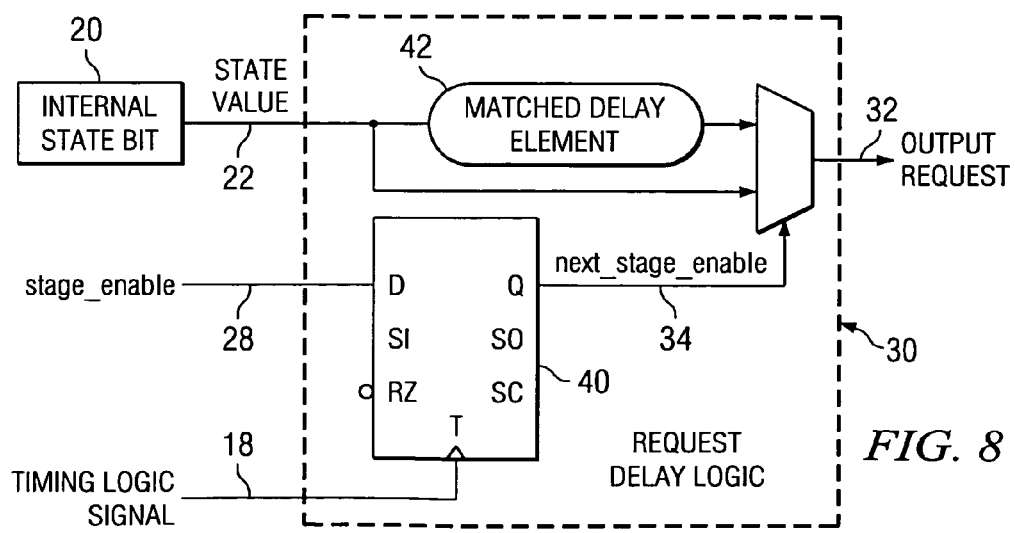
FIG. 8 is a diagram illustrating the request delay logic shown in FIG. 7 and an example of the local generation of the next_stage_enable signal by capture of the stage_enable signal, according to one embodiment of the invention.

FIG. 8 is a diagram illustrating the request delay logic 30 shown in FIG. 7 and an example of the local generation of the next_stage_enable signal 34 by capture of the stage_enable signal 28, according to one embodiment of the invention. The capture is made by a dedicated storage element 40 sensitive to the assertion of the timing logic signal 18. When the stage_enable signal 28 is de-asserted, the local clock does not pulse during the unstable period in which the timing logic signal is asserted. Any storage elements in the context of system 10 clocked by the local clock will not change in value, and the datapath using their data will not be affected. In this case, the output request 32 is allowed to race ahead, as no matched delay is required in such case.

The scope of the present disclosure includes any novel feature or combination of features disclosed therein either explicitly or implicitly or any generalization thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependant claims may be combined with those of the independent claims in any appropriate manner and not merely in the specific combinations enumerated in the claims.

What is claimed:

1. An apparatus, comprising:
   timing logic;
   an internal state responsive to said timing logic;
   request delay logic responsive to a value from said internal state; and
   a pulse controller responsive to said timing logic, said pulse controller outputting a clock pulse.

2. The apparatus of claim 1, wherein said clock pulse is a local clock pulse for two-phase asynchronous handshake circuits.

3. The apparatus of claim 1, wherein the tuning logic compares an internal state with each pending request signal and each acknowledge signal and asserts a signal when each connected request and acknowledge has arrived.

4. The apparatus of claim 1, wherein the clock pulse is created by the pulse controller upon assertion a signal from the timing logic.

5. The apparatus of claim 1, wherein the internal state is toggled upon assertion of a signal from the timing logic.

6. The apparatus of claim 5, wherein the timing logic signal is deasserted after a short delay in response to the change in the toggled state value.

7. The apparatus of claim 6, wherein the short delay is facilitated by a comparison failure with a new inverted value of the internal state.

8. The apparatus of claim 1, wherein a falling edge of the local clock pulse is created by the pulse controller upon deassertion of a signal from the timing logic.

9. The apparatus of claim 1, wherein logic propagation time delays involved in a change of internal state prompted by assertion of a signal from the timing logic, plus delay associated with the timing logic itself, is made by design alone greater than a minimum pulse width tolerated by storage elements clocked by the local clock pulse.

10. The apparatus of claim 1, wherein polarity of a requested output is one of equal to polarity of the internal state and an inverted version of the polarity of the internal state.

11. The apparatus of claim 1, wherein the internal state is resetable to one of a logic one and logic zero.

12. The apparatus of claim 1, wherein the internal state is selectively forced to a value of a signal from the timing logic.

13. The apparatus of claim 12, wherein a control signal selectively forces the internal state to a value of a signal from the timing logic.

14. The apparatus of claim 13, wherein the selective forcing is used for purposes of circuit defect testing.

15. The apparatus of claim 1, wherein a signal from the timing logic is continuously sampled by a test clock and captured by an additional state element.

16. The apparatus of claim 2, wherein the local clock pulse is generated by the pulse controller only when a stage enable input is asserted.

17. The apparatus of claim 1, wherein a matched delay element in the request delay logic is bypassed when a next-stage enable signal is asserted.

18. The apparatus of claim 1, wherein a next-stage enable signal is a version of a stage-enable signal continuously sampled by a signal from timing logic.

19. A method, comprising the steps of:
    providing timing logic;
    providing internal state responsive to said timing logic;
    providing request delay logic responsive to said internal state; and
    providing a pulse controller responsive to said timing logic, said pulse controller outputting a clock pulse.

20. The method of claim 19, wherein said clock pulse is output by said pulse controller.

21. The method of claim 19, wherein the timing logic compares an internal state with each pending request signal and each acknowledge signal and asserts a signal when each connected request and acknowledge has arrived.

22. The method of claim 19, wherein the clock pulse is created by the pulse controller upon assertion a signal from the timing logic.

23. The method of claim 19, wherein the timing logic signal is toggled after a short delay in response to the change in the toggled state value.

24. The method of claim 19, further comprising, responsive to assertion of a signal from the timing logic, forcing the timing logic's signal to be deasserted after a short delay.

25. The method of claim 24, wherein the short delay is facilitated by the comparison failure with a new inverted value of the internal state.

26. The method of claim 19, wherein a falling edge of the local clock pulse is created by the pulse controller upon deassertion of a signal from the timing logic.

27. The method of claim 19, wherein logic propagation time delays involved in a change of internal state prompted by assertion of a signal from the timing logic, plus delay associated with the timing logic itself, is made by design alone greater than a minimum pulse width tolerated by storage elements clocked by the local clock pulse.

28. The method of claim 19, wherein polarity of a requested output is one of equal to polarity of the internal state and an inverted version of the polarity of the internal state.

29. The method of claim 19, wherein the internal slate may be reset to either a logic one or logic zero.

30. The method of claim 19, wherein the internal state may be scanned in a conventional DFT manner.

31. The method of claim 19, wherein the internal state may be selectively forced to a value of a signal from the timing logic.

32. The method of claim 31, wherein a control signal selectively forces the internal state to a value of a signal from the timing logic.

33. The method of claim 32, wherein the selective forcing is used for purposes of circuit defect testing.

34. The method of claim 19, wherein a signal from the timing logic is continuously sampled by a test clock and captured by an additional state element.

35. The method of claim 19, wherein the local clock pulse is generated by the pulse controller only when a stage enable input is asserted.

36. The method of claim 19, wherein a matched delay element in the request delay logic is bypassed when a next-stage enable signal is asserted.

37. The method of claim 19, wherein a next-stage enable signal is a version of the stage-enable signal continuously sampled by a signal from timing logic.

38. The method of claim 19, wherein the clock pulse is an input for a two-phase asynchronous handshake circuit.

* * * * *